(12) United States Patent
Ueki et al.

(10) Patent No.: US 7,467,261 B2
(45) Date of Patent: Dec. 16, 2008

(54) DUAL STORAGE APPARATUS AND CONTROL METHOD FOR THE DUAL STORAGE APPARATUS

(75) Inventors: Toshikazu Ueki, Kawasaki (JP); Takaharu Ishizuka, Kawasaki (JP); Takao Matsui, Kawasaki (JP); Makoto Hataida, Kawasaki (JP); Yuka Hosokawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 283 days.

(21) Appl. No.: 11/237,934

(22) Filed: Sep. 29, 2005

(65) Prior Publication Data
US 2006/0212656 A1      Sep. 21, 2006

(30) Foreign Application Priority Data
Mar. 17, 2005    (JP)    ............... 2005-076591

(51) Int. Cl.
*G06F 12/00* (2006.01)
(52) U.S. Cl. .................. 711/131; 711/154; 711/156; 711/168; 711/170
(58) Field of Classification Search .................. None
See application file for complete search history.

(56) References Cited

U.S. PATENT DOCUMENTS

| | | | | |
|---|---|---|---|---|
| 3,521,240 A | * | 7/1970 | Bahrs et al. ............... 711/2 |
| 4,136,384 A | * | 1/1979 | Okada et al. ............... 709/251 |
| 4,543,652 A | * | 9/1985 | Amada et al. ............... 370/368 |
| 6,687,857 B1 | * | 2/2004 | Iwata et al. ................ 714/38 |

FOREIGN PATENT DOCUMENTS

| | | |
|---|---|---|
| JP | 57-101950 | 5/1985 |
| JP | 62-140183 | 6/1987 |
| JP | 4-149653 | 5/1992 |
| JP | 8-297588 | 11/1996 |
| KR | 10-0205031 | 7/1998 |

* cited by examiner

*Primary Examiner*—Hyung S Sough
*Assistant Examiner*—Mardochee Chery
(74) *Attorney, Agent, or Firm*—Staas & Halsey LLP

(57) ABSTRACT

A dual storage apparatus is provided that comprises a first and a second memories for respectively retaining a set of identical data and a selector for selecting either of the two (2) sets of the data respectively read from the first and the second memory based on a read control signal inputted into the selector, having a request management unit for, when the read control signal has been inputted, attaching an identifier for identifying the read control signal to the inputted read control signal and outputting the signal and the identifier; and a plurality of memory control units for each of the first and the second memories. The dual storage apparatus detects a synchronization error by verifying coincidence of the identifier attached by the request management unit and controls the selector such that the data from a system from which no synchronization error has been detected.

18 Claims, 13 Drawing Sheets

FIG. 6

| SYNCHRONIZATION CHECK | | ECC CHECK | | COINCIDENCE CHECK | OPERATION OF SELECTOR CONTROL CIRCUIT |
|---|---|---|---|---|---|
| A SYSTEM | B SYSTEM | A SYSTEM | B SYSTEM | | |
| O | O | O | O | O | BOTH OF A SYSTEM AND B SYSTEM |
| × | O | — | O | — | B SYSTEM |
| O | × | O | — | — | A SYSTEM |
| × | × | O | O | — | SYSTEM ERROR NOTIFICATION |
| O | O | × | O | — | B SYSTEM |
| O | O | O | × | — | A SYSTEM |
| O | O | × | × | — | SYSTEM ERROR NOTIFICATION |
| O | O | O | O | × | SYSTEM ERROR NOTIFICATION |

DUAL STORAGE APPARATUS AND CONTROL METHOD FOR THE DUAL STORAGE APPARATUS

BACKGROUND OF THE INVENTION

1. Field of the Invention

The present invention relates to a dual storage apparatus which includes a memory for retaining data and an input/output system for the memory, both of which are dualized to improve reliability, and to a control method for the dual storage apparatus.

2. Description of the Related Art

Currently, the scope within which computers are needed industrially has been expanded and improved reliability is demanded for the computers. One type of reliability that is demanded for a computer is fault tolerance that guarantees that the computer can operate continuously even when a resource used in the computer (such as a CPU (Central Processing Unit), a memory, a hard disk, etc) has become defective, and another one is error tolerance that is an ability to be able to detect and correct a data error such as a bit invert generated in the course of transmission of information.

As one of the methods of improving the reliability demanded for a computer, multiplexing of the resources can be listed. For example, according to Japanese Patent Application Laid-Open Publication Nos. 1987-140153, 1992-149653, 1982-101950 and 1996-297588, configurations are described each of which has a memory dualized and identical data are written respectively into each of the counterpart memories included in the dual memory, the two (2) sets of data read from the counterpart memories respectively are compared with each other when the data have been read, and the set of data to be used for processing are selected.

Therefore, the fault tolerance can be improved because, even when one (1) counterpart memory has become defective, the data stored in the other counterpart memory can be used. In addition, because the date can not be used until the two (2) sets of data read from the dual memory coincide, detection/correction of errors in the data are executed during the comparison, thereby, the error tolerance can be improved.

A memory is controlled by a memory controller that processes read requests and write requests issued to the memory. In recent years, an LSI (Large Scale Integration) used in this memory controller has a complicated configuration due to the increase in capacity of a DIMM (Dual Inline Memory Module) and grow in the speed of data transfer. Therefore, the possibility that errors occur in the LSI and the possibility that the LSI is affected by the exterior environment through, for example, disturbance have become high.

When memories are dualized, the input/output system for each of the memories is also dualized and a memory controller is provided to each counterpart input/output system. Then, in general, two (2) memory controllers operate symmetrically (i.e., being synchronized). However, the controllers provided respectively to the counterpart input/output systems may operate differently from each other because of errors having occurred internally or disturbance even though the LSIs are those that operate symmetrically (i.e., being synchronized) under completely same conditions.

When the operation of the counterpart memory controllers in the dual memory becomes asymmetry (not being synchronized), phenomena such as, for example, a timing lag between the sets of data, loss of data, wrong order of data may occur to the computer. For example, when the data have been read, the two (2) sets of data read from the counterpart memories do not coincide only because of a timing lag between the sets of data. In this case, both sets of data themselves have not been destroyed, however, the computer can not determine which set of data should be used for processing. Therefore, continuous operation of the computer becomes impossible.

As described above, the prior art has a problem that, even when a memory is dualized, the operation of the computer is required to stop due to the malfunction of an LSI used in the memory controller and, then, the continuous operation of the computer becomes impossible even when the memory is dualized, therefore, the reliability demanded for the computer is degraded.

SUMMARY OF THE INVENTION

It is therefore an object of the present invention to provide a dual storage apparatus which enables further the continuous operation of a computer without degrading the reliability demanded for the computer, and a control method for the dual storage apparatus.

In order to achieve the above object, according to a first aspect of the present invention there is provided a dual storage apparatus including a first and a second memories for respectively retaining a set of identical data, and a selector for selecting either of the two (2) sets of data read from the first and the second memories based on a read control signal inputted into the selector, wherein the dual storage apparatus comprises a request management unit for, when the read control signal has been inputted, attaching an identifier for identifying the read control signal to the inputted read control signal and outputting the signal and the identifier; a first main memory control unit for reading the data from the first memory based on the read control signal outputted from the request management unit, and outputting a set of data read from the first memory with the identifier attached to the read control signal outputted from the request management unit; a first sub memory control unit for inputting the read control signal outputted from the request management unit and the data read by the first main memory control unit, and outputting the inputted data with the identifier attached to the read control signal outputted from the request management unit; a second main memory control unit for reading the data from the second memory based on the read control signal outputted from the request management unit, and outputting a set of data read from the second memory with the identifier attached to the read control signal outputted from the request management unit; a second sub memory control unit for inputting the read control signal outputted from the request management unit and the data read by the second main memory control unit, and outputting the inputted data with the identifier attached to the read control signal outputted from the request management unit; a synchronization checking unit for verifying coincidence of the identifiers inputted from the first memory control unit and the first sub memory control unit, and coincidence of the identifiers inputted from the second main memory control unit and the second sub memory control unit; and a selector control unit for controlling the selector based on the result of the verification.

Preferably, the dual storage apparatus further comprises a coincidence checking unit for verifying whether or not the set of data read from the first memory and the set of data read from the second memory coincide when coincidence of the identifiers inputted from the first main memory control unit and the first sub memory control unit and coincidence of the identifiers inputted from the second main memory control unit and the second sub memory control unit have been both verified, and wherein the selector control unit outputs a system error when the coincidence has not been verified by the coincidence checking unit. Preferably, when coincidence of the identifiers inputted from the first main memory control unit and the first sub memory control unit has been verified, the selector control unit controls the selector such that the set of data read from the first memory is selected, and, when the coincidence of the identifiers inputted from the first main memory control unit and the first sub memory control unit has not been verified and coincidence of the identifiers inputted from the second main memory control unit and the second sub memory control unit has been verified, controls the selector such that the set of data read from the second memory is selected. Preferably, the selector control unit outputs a system error when coincidence of the identifier inputted from the first main memory control unit and the first sub memory control unit and coincidence of the identifier inputted from the second main memory control unit and the second sub memory control unit have not been both verified by the synchronization checking unit. Preferably, the dual storage apparatus further has a code checking unit for checking an error detection/correction code attached to each set of the data, and wherein, when no uncorrectable error has been detected in either set of data read from the first memory by the code checking unit, the selector control unit controls the selector such that the set of data read from the first memory is selected; and, when an uncorrectable error has been detected in either set of data read from the first memory and no uncorrectable error has been detected in either set of data read from the second memory, controls the selector such that the set of data read from the second memory are selected. Preferably, the selector control unit outputs a system error when an uncorrectable error has been detected in either set of data read from the first memory and an uncorrectable error has been detected in either set of data read from the second memory, by the code checking unit.

In order to achieve the above object, according to a second aspect of the present invention there is provided a controlling method for a dual storage apparatus comprising a first and a second memories for respectively retaining a set of identical data and a selector for selecting either of the two (2) sets of data read from the first and the second memories based on a read control signal inputted into the selector, wherein the dual storage apparatus produces an identifier for identifying the read control signal when the read control signal has been inputted, wherein the dual storage apparatus produces first main data by reading the data from the first memory based on the read control signal and adding the identifier attached to the read control signal, to the data read from the first memory, wherein the dual storage apparatus produces a first sub data by adding the identifier attached to the read control signal, to the data read from the first memory, wherein the dual storage apparatus produces second main data by reading the data from the second memory based on the read control signal and adding the identifier attached to the read control signal, to the data read from the second memory, wherein the dual storage apparatus produces second sub data by adding the identifier attached to the read control signal, to the data read from the second memory, wherein the dual storage apparatus verifies coincidence of the identifiers respectively contained in the first main data and the first sub data and coincidence of the identifiers respectively contained in the second main data and the second sub data, and wherein the dual storage apparatus controls the selector based on the result of the verification.

Using the dual storage apparatus of an embodiment of the present invention, the continuous operation of a computer can be enabled further without degrading the reliability demanded for the computer.

BRIEF DESCRIPTION OF THE DRAWINGS

The above and other objects, aspects, features and advantages of the present invention will become more apparent from the following detailed description when taken in conjunction with the accompanying drawings, in which:

FIG. 6 is a table describing summarized operation of the dual storage apparatus in the embodiment;

DESCRIPTION OF THE PREFERRED EMBODIMENT

An embodiment of the present invention will now be described with reference to the accompanying drawings. It is however to be noted that the technical scope of the present invention is not limited to the embodiment but covers the invention as defined in the appended claims and equivalents thereof.

Figure 1:
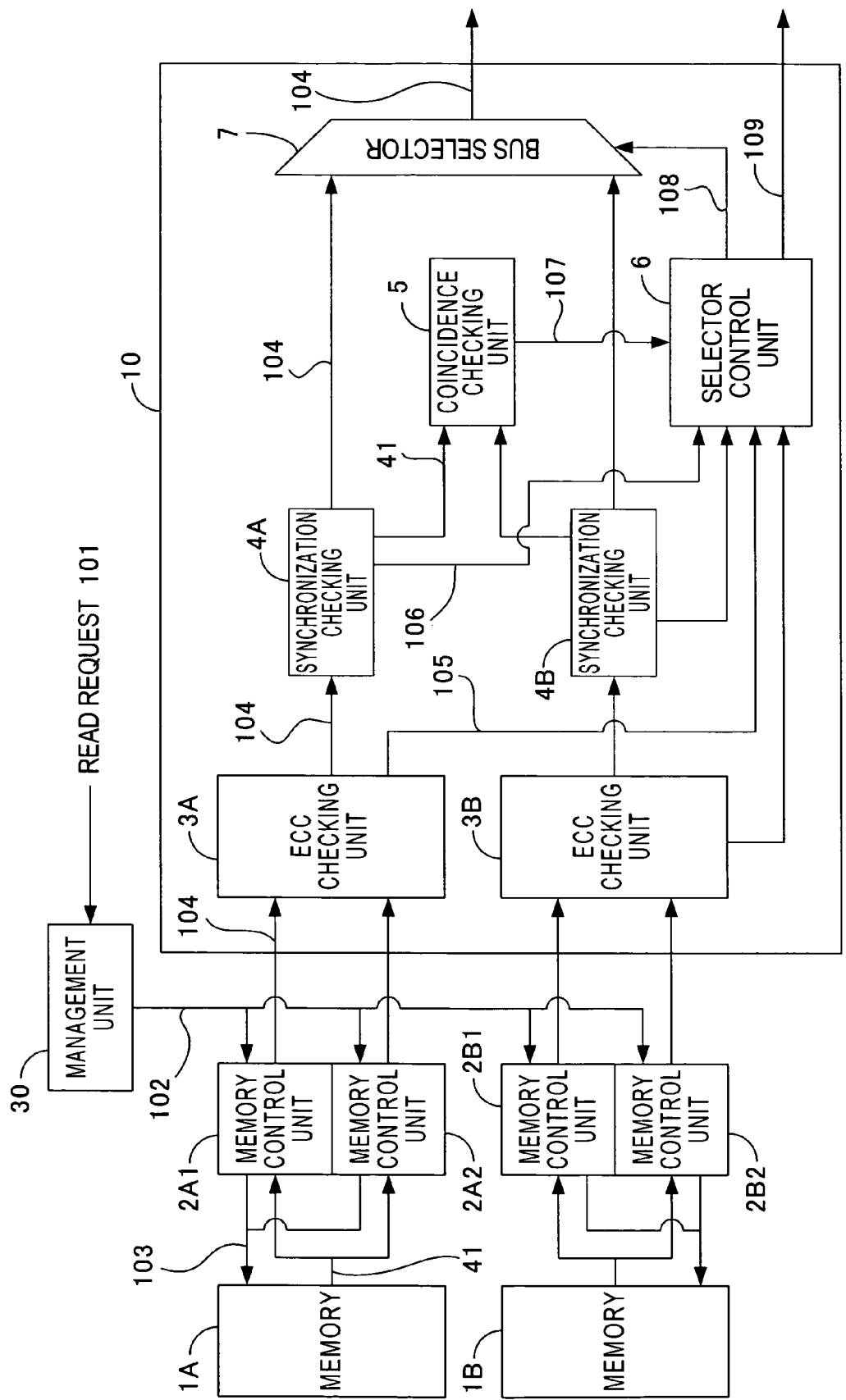
FIG. 1 shows an example of the configuration of a dual storage apparatus in the embodiment.

FIG. 1 shows an example of the configuration of a dual storage apparatus in the embodiment. The dual storage apparatus is connected with a CPU (Central Processing Unit) through a bus not shown and executes processes in response to request signals inputted from the CPU.

For example, in case of a write request, the dual storage apparatus stores data to be written that has been inputted with the write request, into designated addresses respectively in a memory 1A and a memory 1B and notifies the CPU of the process result. In this manner, two (2) sets of identical data are stored respectively in the memory 1A and the memory 1B. When the request is a read request 101, the dual storage apparatus reads data from designated addresses and outputs data 104 including the read data to the CPU or notifies the CPU of a system error 108.

In the dual storage apparatus of the embodiment, a memory containing a plurality of storage elements for storing data is dualized (into the memory 1A and the memory 1B) and, accompanying to this, the input/output system is also dualized. Herein, the input/output system through which data read from the memory 1A are used is referred to as "A system" and the input/output system through which data read from the memory 1B are used is referred to as "B system" to distinguish those systems.

As a feature of the dual storage apparatus of the embodiment, when a read request 101 is inputted, a management unit 30 produces an identifier (a control ID) for identifying the read request 101 and attaches the identifier to the read request 101. This read request-attached with the control ID is outputted to a memory control unit, described later, as a memory control signal 102.

The read request 101 contains an address designated as a read destination, a read command indicating that the process is reading (a write command when the process is writing), etc. The management unit 30 produces control IDs that do not include any same control IDs such that any one of the control IDs is different from others when the time at which each read request 101 to be attached with the control ID is inputted to the dual storage apparatus and the content (a designated address and commands) of the read request 101 are different, and each of the read requests is made identifiable.

Using these control IDs including no same ones, the dual storage apparatus detects synchronization lag errors in order to process requests inputted at different timing. Though a control ID is produced for a read request in the embodiment, a control ID may also be produced for a write request.

Furthermore, as another feature of the dual storage apparatus of the embodiment, two (2) memory control units are provided to each input/output system. That is, in the A system, a memory control unit 2A1 and a memory control unit 2A2 are provided to the memory 1A and, in the B system, a memory control unit 2B1 and a memory control unit 2B2 are provided to the memory 1B. When the read request 101 has been inputted to the management unit 30, the management unit 30 outputs an identical memory control signal 102 respectively to four (4) memory control units.

The memory control units 2A1 and 2A2 control the memory 1A and the memory control units 2B1 and 2B2 control the memory 2B. Each of the memory control units writes data to be written that is inputted with the write request, into a designated address in response to the write request issued to the memories.

In addition, in response to the read request 101 issued to the memories, each of the memory control units outputs to the memory a designated address of the read destination plus a read command 103, and reads data 41. Then, each of the memory control units adds a header containing a control ID obtained from the memory control signal 102, to the data 41 read from the memory and provides the data with the header 104 to a data control unit 10 in a latter stage.

The data control unit 10 comprises ECC checking units (code checking units), synchronization checking units, a coincidence checking unit 5, a selector control unit 6 and a bus selector 7. The ECC checking units and the synchronization checking units are provided respectively to the A system and the B system.

Based on an Error Checking and Correct Code (ECC) contained respectively in the header and the data included in the data with the header 104, the ECC checking units 3A and 3B respectively executes a code check that detects uncorrectable bit errors. When an uncorrectable bit error is detected in the code check, each of the ECC checking units notifies the selector control unit 6 of a code error 105.

Based on the control ID contained in the header included in the data with the header 104, the synchronization checking units 4A and 4B execute respectively a synchronization check that detects synchronization errors that represent a state where the two (2) memory control units contained in each of the input/output systems are not synchronized. When a synchronization error has been detected in the synchronization check, each of the synchronization checking units notifies the selector control unit 6 of the synchronization error 106.

The synchronization checking units 4A and 4B respectively check whether or not both of the entire headers coincide and, when the headers do not coincide, a synchronization error can be determined to have occurred. In addition, when the control IDs contained respectively in the headers do not coincide, the synchronization checking units 4A and 4B may determine that a synchronization error has occurred.

In order to detect a multiple defect that can not be detected by each of the synchronization checking units and each of the ECC checking units, the coincidence checking unit 5 executes a coincidence check that verifies whether or not a set of data read from the memory 1A and a set of data read from the memory 1B coincide when no error has been detected by each of the synchronization checking units and each of the ECC checking units. Then, the coincidence checking unit 5 notifies the selector control unit 6 of the result 107 of the coincidence check.

The selector control unit 6 inputs into the bus selector 7 a selection signal 108 for selecting the A system or the B system according to the check results from each of the ECC checking units and each of the synchronization checking units. The selector control unit 6 inputs into the bus selector 7 the selection signal 108 for selecting a system for which no error has been notified.

For example, in the case where the ECC checking unit 3A notifies of the code error 105, the selector control unit 6 inputs into the bus selector 7 the selection signal 108 for selecting the B system. In the case where the synchronization checking unit 4B notifies of a synchronization error 106, the selector control unit 6 inputs into the bus selector 7 the selection signal 108 for selecting the A system.

Then, in the case where an error is notified respectively from both of the systems, the selector control unit 6 outputs a system error 109. Similarly, in the case where discrepancy between the two (2) sets of data has been verified in a coincidence check executed by the coincidence checking unit 5, the selector control unit 6 outputs the system error 109.

Based on the selection signal from the selector control unit 6, the bus selector 7 switches the input/output system to be used. In FIG. 1, because the content of the signals in the B system is same as that in the A system, reference numerals for the signals in the B system are omitted.

Figure 2:
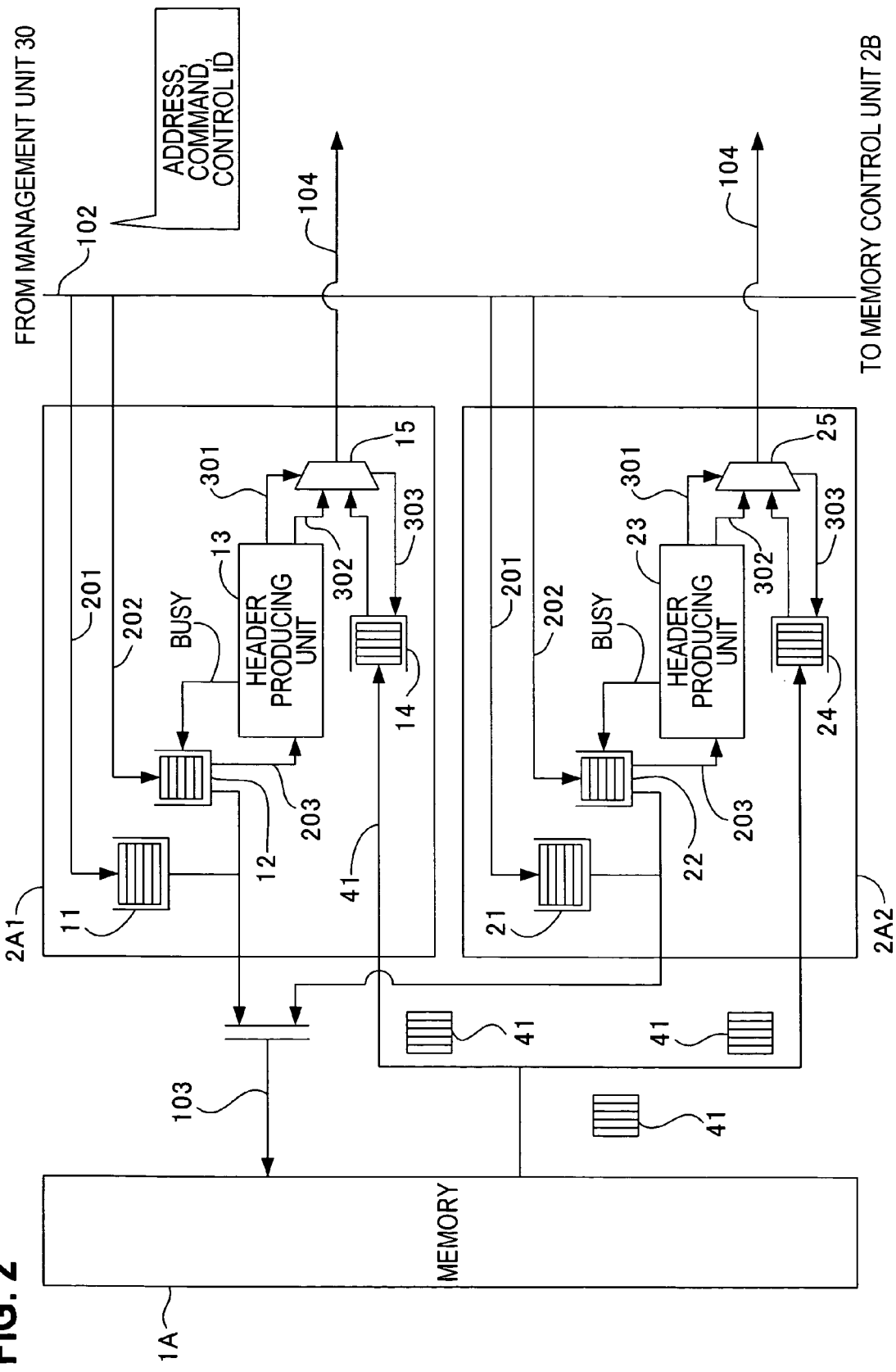
FIG. 2 shows an example of the detailed configuration of the memory control unit in the embodiment.

FIG. 2 shows an example of the detailed configuration of the memory control unit in the embodiment. In FIG. 2, the configuration relating to the A system is shown. However, the configuration of the memory control units 2B1 and 2B2 is same as that of the memory control units 2A1 and 2A2.

The read control signal 102 contains an address, a read command and a control ID. The address is information indicating the position of the data on the memory. The read command indicates that the signal is a read request. The control ID is an identifier for identifying uniquely the read request and is produced by the management unit 30.

Among the information contained in the read control signal 102 inputted by the management unit 30, an address 201 is stored in address queues 11 and 21. Then, among the information contained in the read control signal 102 inputted by the management unit 30, the read command plus a control ID 202 are stored in command queues 12 and 22.

The command queues 12 and 22 are registers that store respectively a read command and a control ID and, in response to a read request, operate synchronizing with an address that has entered the address queue 11. In the case where valid commands are stored in the command queues 12 and 22, the read commands are executed one after another to the memory 1A.

When a command is executed, information necessary for producing a header is outputted from the command queue 12 to a producing unit 13. A control ID 203 is contained in this information.

The address queues 11 and 21 operate synchronizing with the command queues 12 and 22. The address stored respectively in the address queues 11 and 21 is transmitted to the memory 1A, synchronizing with the execution of the read command to the memory 1A.

In this manner, the read command plus the address 103 are inputted into the memory. Then, the data 41 having been read are stored in data queues 14 and 24. The data queues 14 and 24 are registers that accumulate the data 41 read from the memory 1A.

The header producing unit 13 produces a header 302 necessary for data transmission as well as executes control for keeping transmission of the header 302 waiting until the data 41 read from the memory 1A arrives. Then, the header producing unit 13 outputs a selector control signal 301 for controlling a selector 15 such that the order of the header and the data is the header plus the data. Furthermore, the header producing unit 13 manages the data queues 14 and 24 and, when the resources in the data queues 14 and 24 have depleted, outputs a BUSY signal to the command queues 12 and 22 to prevent them from outputting.

Based on the selector control signal 301 inputted from the header producing unit 13, the selector 15 switches the header system and the data system such that the header plus the data are transmitted in this order. Then, the selector 15 outputs a read pointer control signal 303 to the data queue 14 in order to execute control to the data queue 14 to output necessary data. Based on the read pointer control signal from the selector 15, the data queue 14 outputs data having a necessary packet length.

In this manner, the header produced by the header producing unit 13 is attached to the set of data 41 read from the memory 1A and the data with the header 104 are inputted from the memory control unit to the data control unit in the latter stage.

Figure 3:
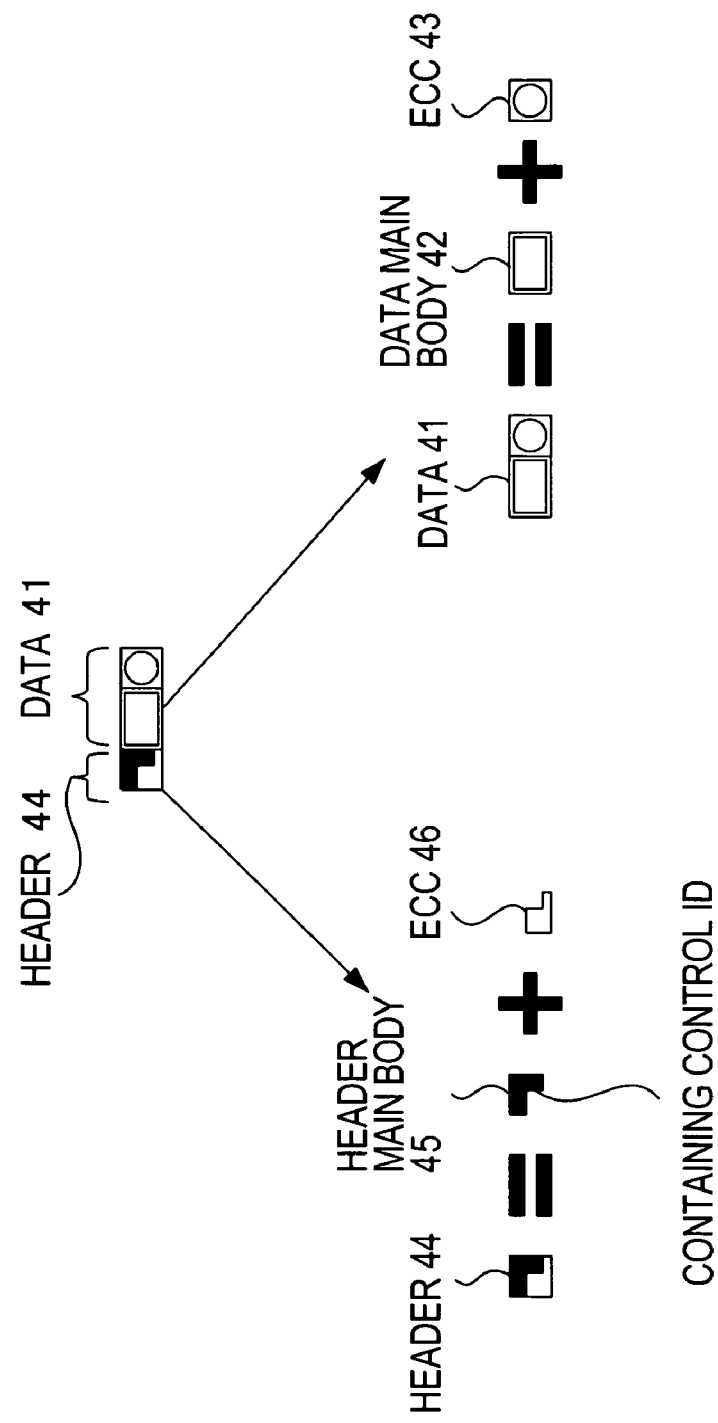
FIG. 3 shows an example of the configuration of the data with the header.

FIG. 3 shows an example of the configuration of the data with the header 104. The data with the header 104 are decomposed into a header 44 and the data 41. Among these, the header 44 is further decomposed into a header main body 45 and an ECC 46 which is a redundant code for the head main body 45. The control ID 203 is contained in the header main body 45.

Furthermore, the data 41 are decomposed into a data main body 42 and an ECC 43 which is a redundant code for the data main body. A bit invert in the course of transmission is detected by the ECC 46 for the header and the ECC 43 for the data.

Figure 4:
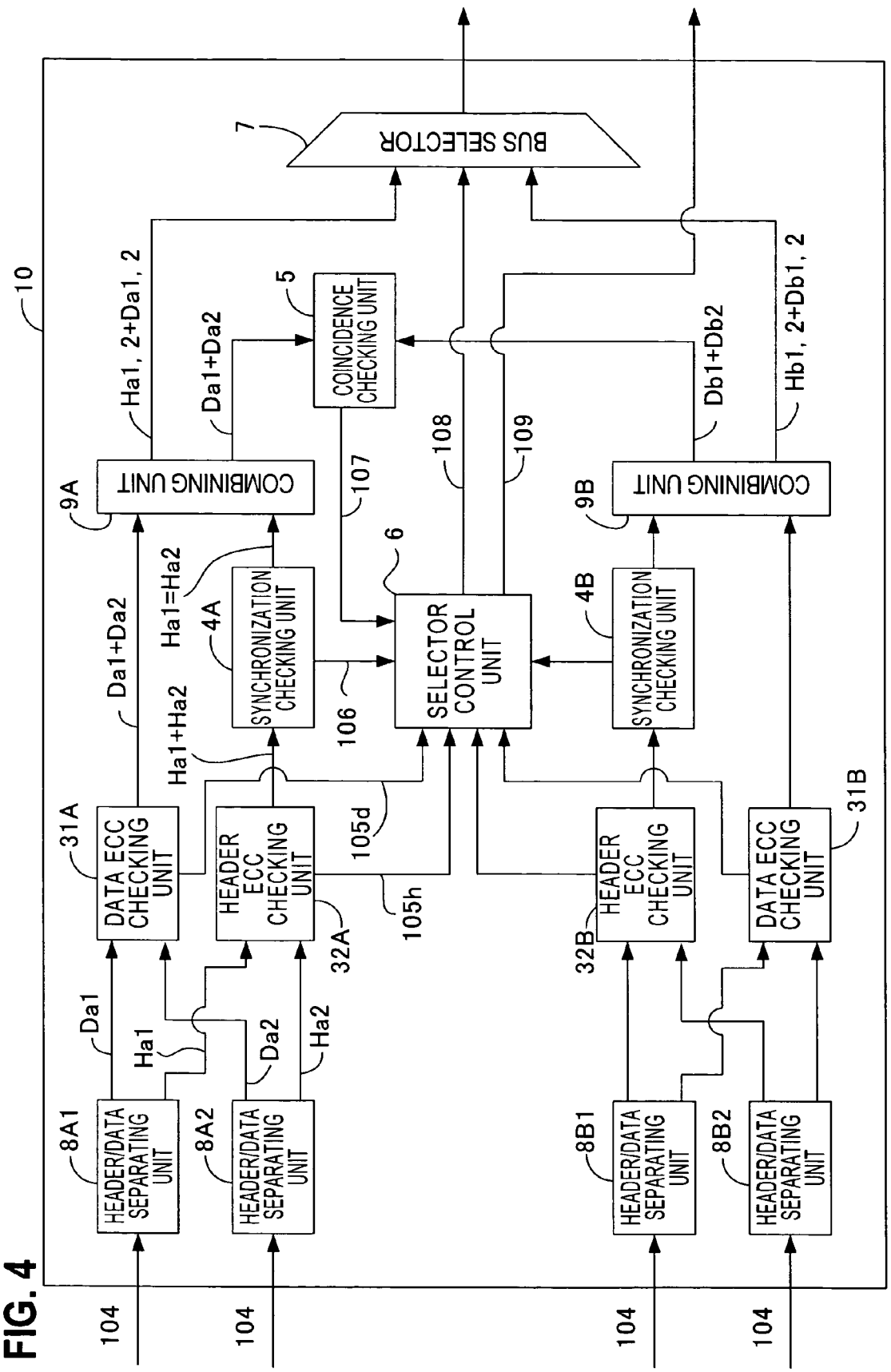
FIG. 4 shows an example of the detailed configuration of the data control unit in the embodiment.

FIG. 4 shows an example of the detailed configuration of the data control unit 10 in the embodiment. At a stage before the ECC checking units 3A and 3B shown in FIG. 1, four (4) (HD separating units 8A1, 8A2, 8B1 and 8B2) header/data separating units (HD separating units) in total for decomposing the data with the header 104 to be inputted into the data control unit 10 into the header 44 and the data 41 are provided.

The ECC checking units 3A and 3B shown in FIG. 1 are divided into data ECC checking units 31A and 31B that check the ECC 43 of the data and header ECC checking units 32A and 32B that check the ECC 46 of the header. Then, at a stage after the synchronization checking units 4A and 4B, combining units 9A and 9B for re-combining the header 44 and the data 41 that have once been once separated are provided. The above points have been made more detailed than those of FIG. 1.

The HD separating unit 8A1 separates the data with the header 104 inputted from the memory control unit 2A1, into a header H$a$1 and data D$a$1. Similarly, the HD separating unit 8A2 separates the data with the header 104 inputted from the memory control unit 2A2 into a header H$a$2 and data D$a$2. Then, the data D$a$1 and D$a$2 are inputted into the data ECC checking unit 31A and the headers h$a$1 and h$a$2 are inputted into the header ECC checking unit 32A.

Having detected an uncorrectable bit error in either of the data D$a$1 and D$a$2, the data ECC checking unit 31A inputs a code error 105*d* relating to the data into the selector control unit 6. Having detected an uncorrectable bit error in either of the headers H$a$1 and H$a$2, the header ECC checking unit 32A inputs a code error 105*h* relating to the header into the selector control unit 6.

Then, the header ECC checking unit 32A inputs the headers H$a$1 and H$a$2 into the synchronization checking unit 4A. Having detected a synchronization error based on the control ID contained in the header, the synchronization checking unit 4A notifies the selector control unit 6 of the synchronization error 106.

The combining units 9A and 9B recombine the header 44 and the data 41 that have been separated, and input the combined header 44 and the data 41 into the bus selector 7. The combining units 9A and 9B input the data 41 into the coincidence checking unit 5.

The description for the remaining portions is same as that in FIG. 1 and, therefore, is omitted.

Figure 5:
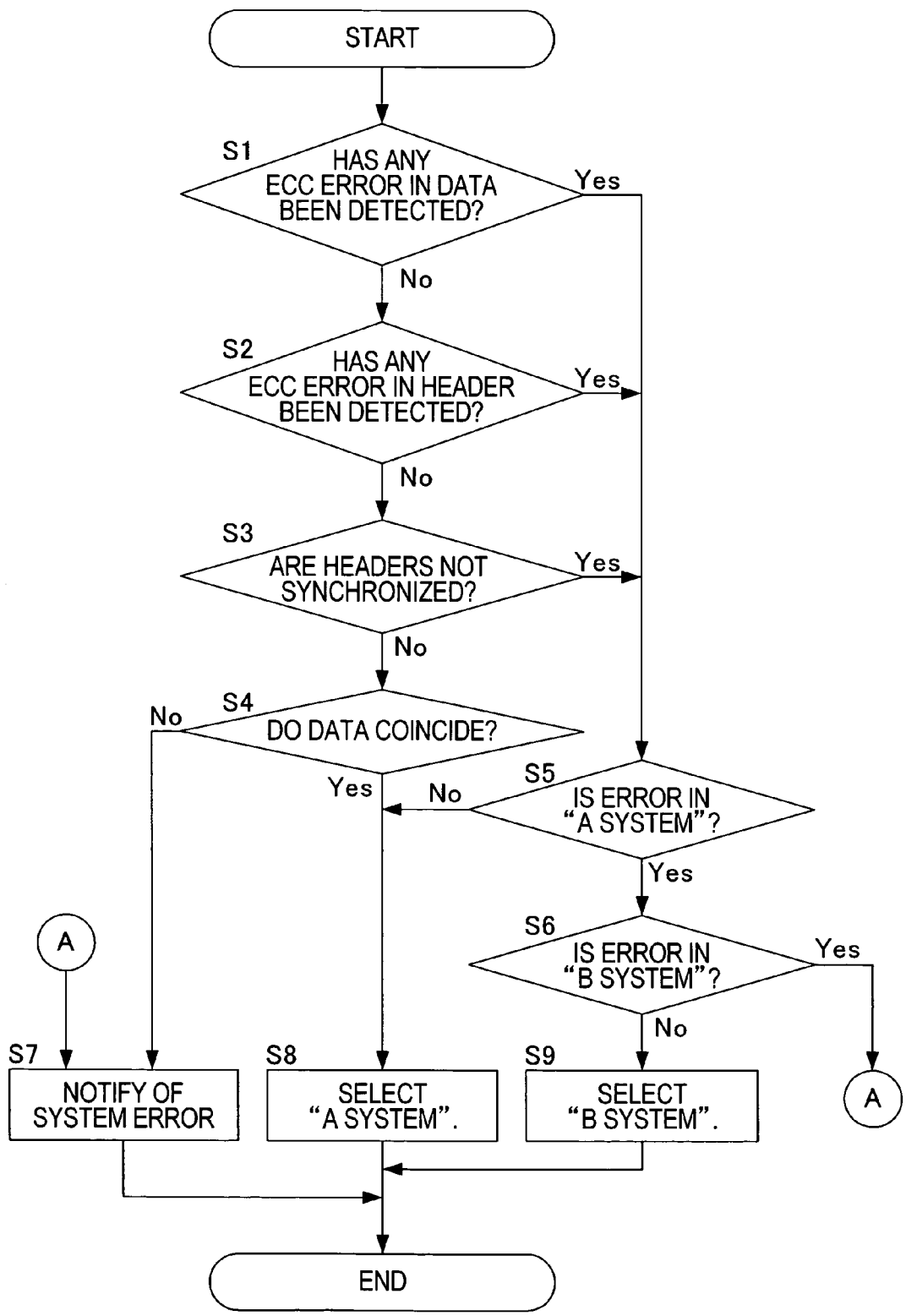
FIG. 5 is a flowchart describing the operation of the selector control unit in the embodiment.

FIG. 5 is a flowchart describing the operation of the selector control unit 6 in the embodiment. First, the selector control unit 6 determines whether or not any data ECC error has occurred (S1). If the code error 105*d* relating to the data has been inputted by the data ECC checking units 31A and 31B, the selector control unit 6 determines that a data ECC error has occurred. In this case, to which system the error has occurred is also notified to the selector control unit 6.

In the case where no data ECC error has occurred (S1 No), the selector control unit 6 determines whether or not any header ECC error has occurred (S2). If the code error 105*h* relating to the header has been inputted by the header ECC checking units 32A and 32B, the selector control unit 6 determines that a header ECC error has occurred. In this case, to which system the error has occurred is also notified to the selector control unit 6.

In the case where no header ECC error has occurred (S2 No), the selector control unit 6 determines whether or not any synchronization error has occurred (S3). If the synchronization error 106 has been inputted by the synchronization checking units 4A and 4B, the selector control unit 6 determines that a synchronization error has occurred. In this case, to which system the error has occurred is also notified to the selector control unit 6.

In the case where no error has been detected by the code check and the synchronization check (S3 No), the selector control unit 6 determines whether or not the sets of data read from the memory 1A and memory 1B coincide (S4). If the sets of data from both of the systems coincide (S4 Yes), the set of data from either system may be used and, in this case, the selector control unit 6 outputs a selection signal that controls the selector such that the set of data read from the memory 1A is used (S8). In this case, the selector may be controlled such that the set of data read from the memory 1A is used.

In the case where no error has been detected by the code check and the synchronization check, however, the sets of data from both systems do not coincide (S4 No), which set of data should be used can not be determined and the selector control unit 6 outputs the system error (S7).

In the case where an error has been detected by the code check and the synchronization check (S1 Yes, S2 Yes and S3 Yes), the selector control unit 6 determines whether or not the system to which the error has been detected is the A system (S5). In the case where the error has been detected in the B system (S5 No), the selector control unit 6 outputs a selection signal that controls the selector such that the set of data read from the memory 1A is used (S8).

In the case where an error has been detected in the A system (S5 Yes), the selector control unit 6 determines whether or not the error has been detected also in the B system (S6). In the case where no error has been detected in the B system (S6 No), the selector control unit 6 outputs a selection signal that controls the selector such that the set of data read from the memory 1B is used (S9).

In the case where an error has been detected in both of the A system and the B system (S6 Yes), the selector control unit 6 outputs the system error (S7). The operation of FIG. 5 described above is summarized in the table of FIG. 6.

The operation will be described as follows referring to a detailed example.

Figure 7:
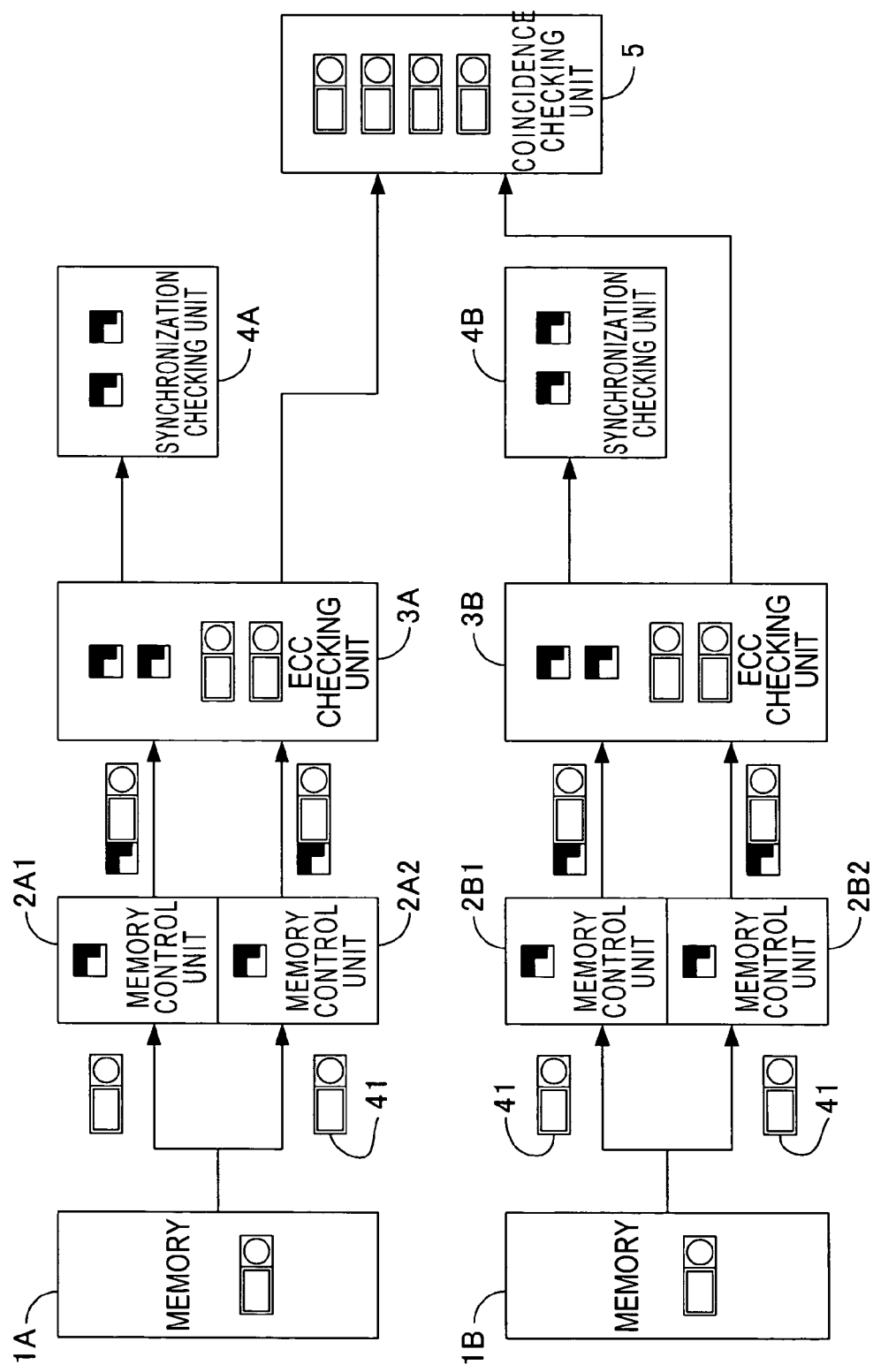
FIG. 7 is an explanatory view of the normal operation of the dual storage apparatus in the embodiment.

FIG. 7 is an explanatory view of the normal operation of the dual storage apparatus in the embodiment. The data 41 read from the memory 1A are inputted into the memory control units 2A1 and 2A2. The memory control units 2A1 and 2A2 attach identical headers respectively to the inputted data and input the data with the header 104 into the ECC checking unit 3A.

The ECC checking unit 3A executes a code check on the header and the data. In this check, no error is detected. The ECC checking unit 3A inputs the header into the synchronization checking unit 4A.

In the synchronization checking unit 4A, a synchronization check on the header is executed. Similarly, in this check, no error is detected. A same process is also executed for the B system. A code check is executed in the ECC checking unit 3B and a synchronization check is executed in the synchronization checking unit 4B. Similarly, in these checks, no error is detected.

Finally, the set of data read from the memory 1A and the set of data read from the memory 1B are inputted into the coincidence checking unit 5 and a coincidence check is executed. Then, based on the fact that no error has been detected, the selector control unit 6 controls the bus selector 7 such that, for example, the set of data read from the memory 1A is used.

Figure 8:
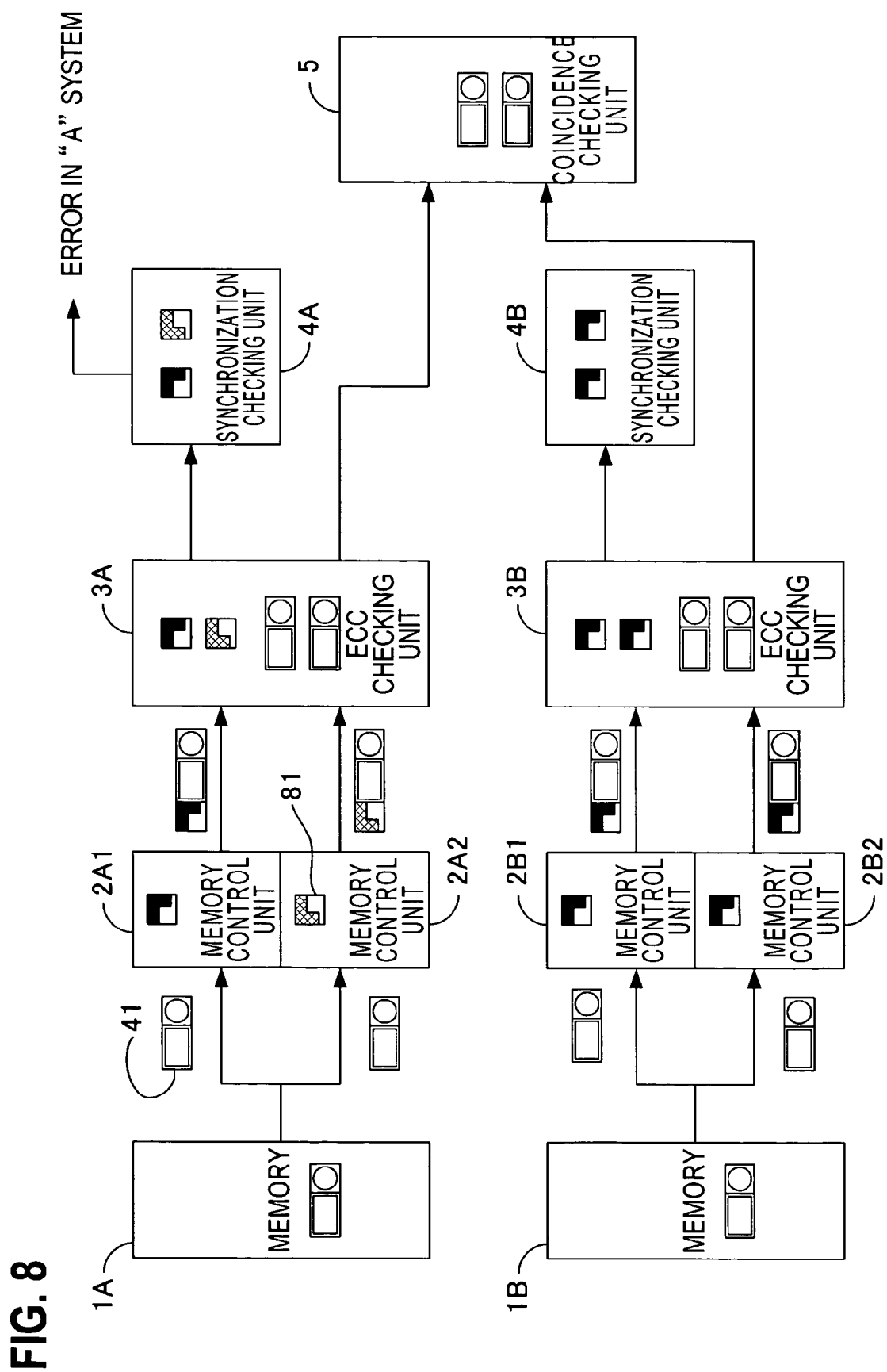
FIG. 8 is an explanatory view of an example of the case where the dual storage apparatus detects an error in one system in a synchronization check.

FIG. 8 is an explanatory view of an example of the case where the dual storage apparatus detects an error in one system in a synchronization check. The set of data 41 read from the memory 1A are inputted into the memory control units 2A1 and 2A2. In FIG. 8, a synchronization lag has occurred between the memory control units 2A1 and 2A2 and a different header 81 is attached in the memory control unit 2A2.

A code check is executed on the header and the data in the ECC checking unit 3A. In this check, no error is detected. This is because no bit invert in the course of the transmission has occurred and no ECC error is detected though the headers accompany the synchronization lag between them.

Then ECC checking unit 3A inputs the header into the synchronization checking unit 4A. A synchronization check on the header is executed in the synchronization checking unit 4A. In this check, a synchronization error is detected. Then, the synchronization checking unit 4A notifies the selector control unit 6 that a synchronization error has been detected in the A system.

A same process is also executed for the B system. A code check is executed in the ECC checking unit 3B and a synchronization check is executed in the synchronization checking unit 4B. In the B system, no error is detected. Finally, the selector control unit 6 controls the bus selector 7 such that the set of data read from the memory 1B is used.

Figure 9:
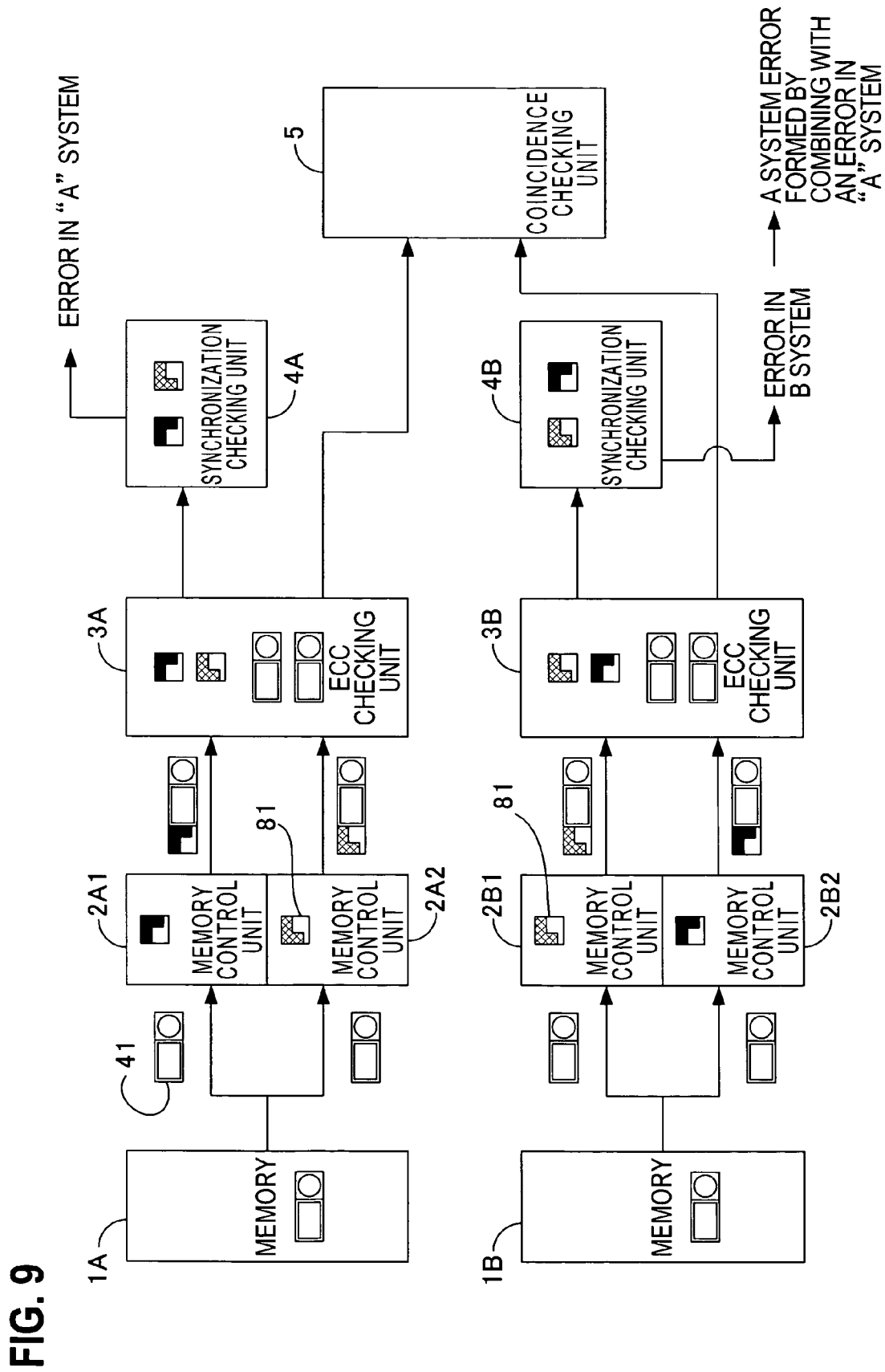
FIG. 9 is an explanatory view of an example of the case where the dual storage apparatus detects errors in both of the system in synchronization checks.

FIG. 9 is an explanatory view of an example of the case where the dual storage apparatus detects errors in both of the systems in synchronization checks. The set of data 41 read from the memory 1A are inputted into the memory control units 2A1 and 2A2. In FIG. 8, a synchronization lag has occurred between the memory control units 2A1 and 2A2, and a different header 81 is attached by the memory control unit 2A2. In addition, a synchronization lag has occurred between the memory control units 2B1 and 2B2, and the different header 81 is attached by the memory control unit 2B1.

A code check is executed on the header and the data in the ECC checking unit 3A. In this check, no error is detected. This is because no bit invert in the course of the transmission has occurred and no ECC error is detected though the headers accompany the synchronization lag between them.

Then, the ECC checking unit 3A inputs the header into the synchronization checking unit 4A. A synchronization check on the header is executed in the synchronization checking unit 4A. In this check, a synchronization error is detected. Then, the synchronization checking unit 4A notifies the selector control unit 6 that a synchronization error has been detected in the A system.

A same process is also executed for the B system. A code check is executed in the ECC checking unit 3B and a synchronization check is executed in the synchronization checking unit 4B. As a result, a synchronization error is detected by the synchronization checking unit 4B. Then, the synchronization checking unit 4B notifies the selector control unit 6 that a synchronization error has been detected in the B system.

In this case, the selector control unit 6 notifies of a system error because an error has been detected respectively in both of the A system and the B system.

Figure 10:
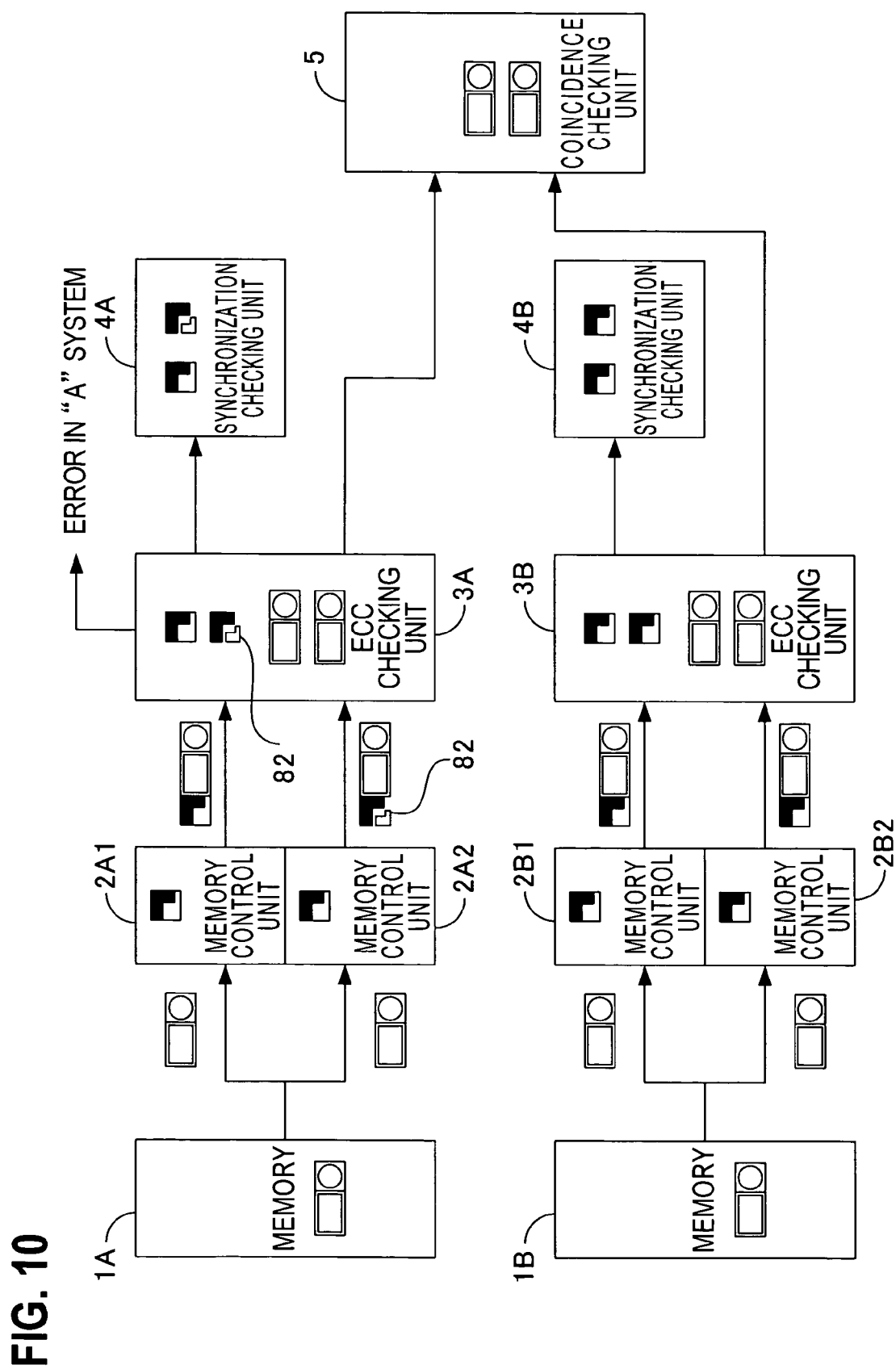
FIG. 10 is an explanatory view of an example of the case where the dual storage apparatus detects an error in one system in an ECC check on the headers.

FIG. 10 is an explanatory view of an example of the case where the dual storage apparatus detects an error in one system in an ECC check on the headers. The set of data 41 read from the memory 1A is inputted into the memory control units 2A1 and 2A2. The memory control units 2A1 and 2A2 attach identical headers respectively to the inputted set of data and input the set of data with the header 104 into the ECC checking unit 3A. In FIG. 8, it is assumed that a bit invert occurs in the header outputted from the memory control unit 2A2 in the course of the transmission to the ECC checking unit 3A (in FIG. 10, a header 82 to which a bit invert has occurred is depicted as a figure that can not become a square even when the header and the ECC are coupled together).

A code check on the header and the data is executed in the ECC checking unit 3A. In this check, a code error relating to the header is detected. Then, the ECC checking unit 3A notifies the selector control unit 6 that a synchronization error has been detected in the A system.

A same process is also executed for the B system. A code check is executed in the ECC checking unit 3B and a synchronization check is executed in the synchronization checking unit 4B. No error is detected in the B system. Finally, the selector control unit 6 controls the bus selector 7 such that the set of data read from the memory 1B is used.

Figure 11:
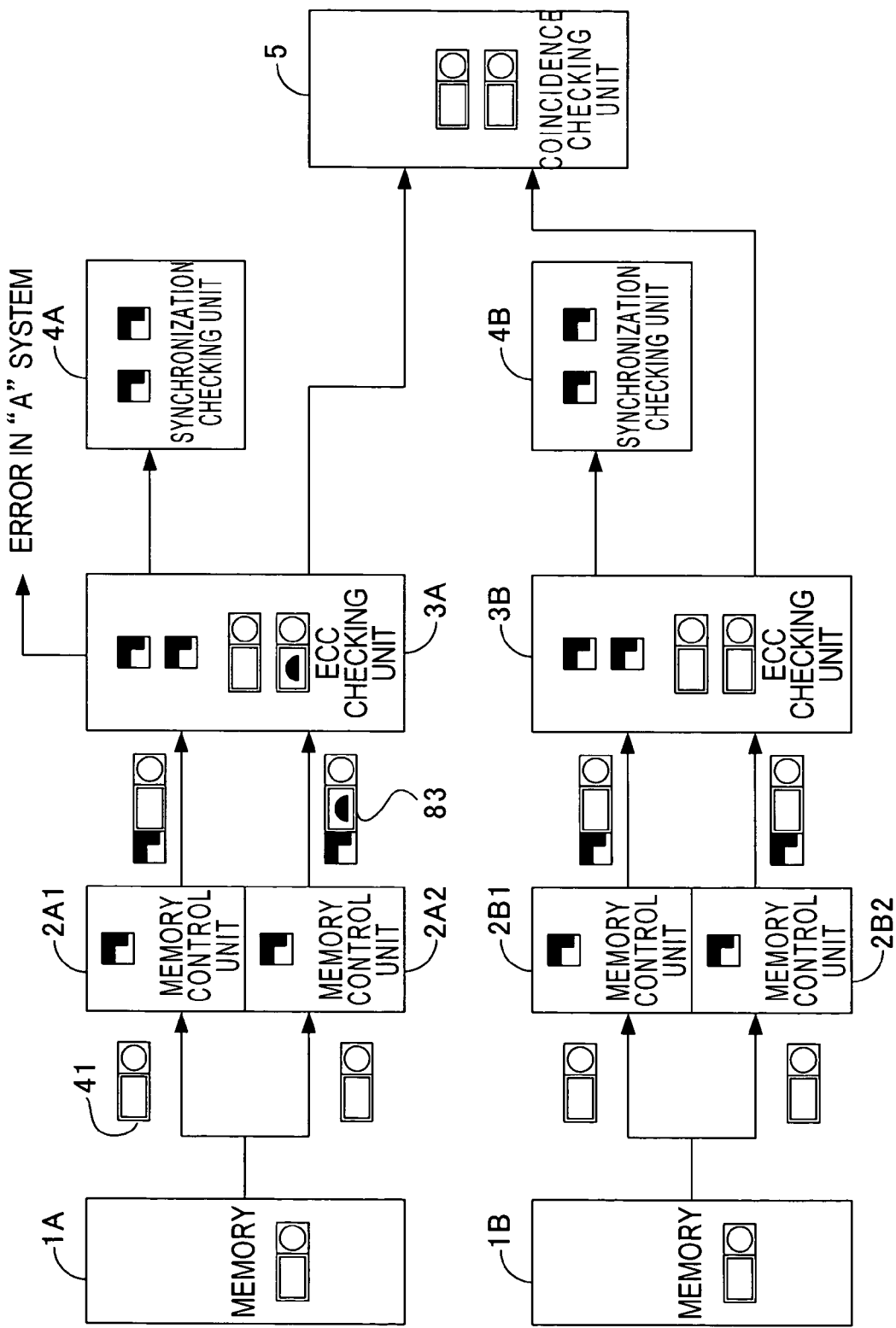
FIG. 11 is an explanatory view of an example of the case where the dual storage apparatus detects an error in one system in an ECC check on the data.

FIG. 11 is an explanatory view of an example of the case where the dual storage apparatus detects an error in one system in an ECC check on the data. The set of data 41 read from the memory 1A are inputted into the memory control units 2A1 and 2A2. The memory control units 2A1 and 2A2 attach an identical header respectively to the inputted set of data and input the set of data with the header 104 into the ECC checking unit 3A. In FIG. 11, it is assumed that a bit invert occurs to the data outputted from the memory control unit 2A2 in the course of transmission to the ECC checking unit 3A (in FIG. 11, a set of data 83 to which a bit invert has occurred is depicted as a figure formed by adding a semicircle painted black to a figure indicating the set of data 41 that has been read).

A code check on the header and the data is executed in the ECC checking unit 3A. In this check, a code error relating to the data is detected. Then, the ECC checking unit 3A notifies the selector control unit 6 that a synchronization error has been detected in the A system.

A same process is also executed for the B system. A code check is executed in the ECC checking unit 3B and a synchronization check is executed in the synchronization checking unit 4B. No error is detected in the B system. Finally, the selector control unit 6 controls the bus selector 7 such that the set of data read from the memory 1B is used.

Figure 12:
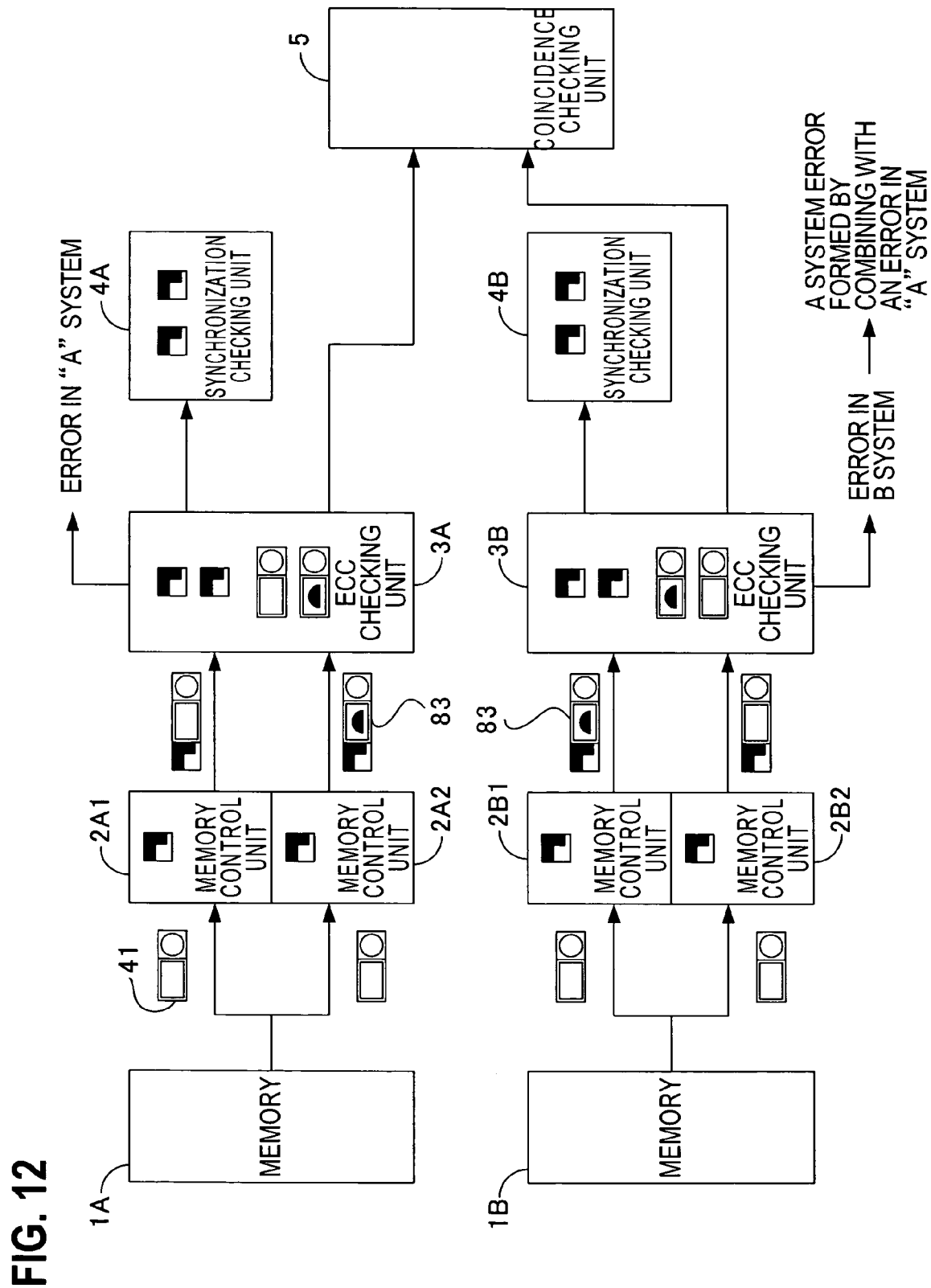
FIG. 12 is an explanatory view of an example of the case where the dual storage apparatus detects errors in both of the systems in synchronization checks on the data.

FIG. 12 is an explanatory view of an example of the case where the dual storage apparatus detects errors in both of the systems in synchronization checks on the data. The set of data 41 read from the memory 1A is inputted into the memory control units 2A1 and 2A2. The memory control units 2A1 and 2A2 attach an identical header respectively to the inputted set of data and input the set of data with the header 104 into the ECC checking unit 3A.

In FIG. 12, it is assumed that a bit invert occurs to the data outputted from the memory control unit 2A2 in the course of transmission to the ECC checking unit 3A (in FIG. 12, the set of data 83 to which a bit invert has occurred is depicted as a figure formed by attaching a semicircle painted black to a figure indicating the set of data 41 that has been read). In addition, it is also assumed that a bit invert occurs to a set of data outputted from the memory control unit 2B1 in the course of transmission to the ECC checking unit 3B.

A code check is executed on the header and the data in the ECC checking unit 3A. In this check, a code error relating to the data is detected. Then, the ECC checking unit 3A notifies the selector control unit 6 that a synchronization error has been detected in the A system.

A same process is also executed for the B system and a code error relating to the set of data is detected by the ECC checking unit 3B. Then, the ECC checking unit 3B notifies the selector control unit 6 that a synchronization error has been detected in the B system.

In this case, the selector control unit 6 notifies of a system error because an error has been detected respectively in both of the A system and the B system.

Figure 13:
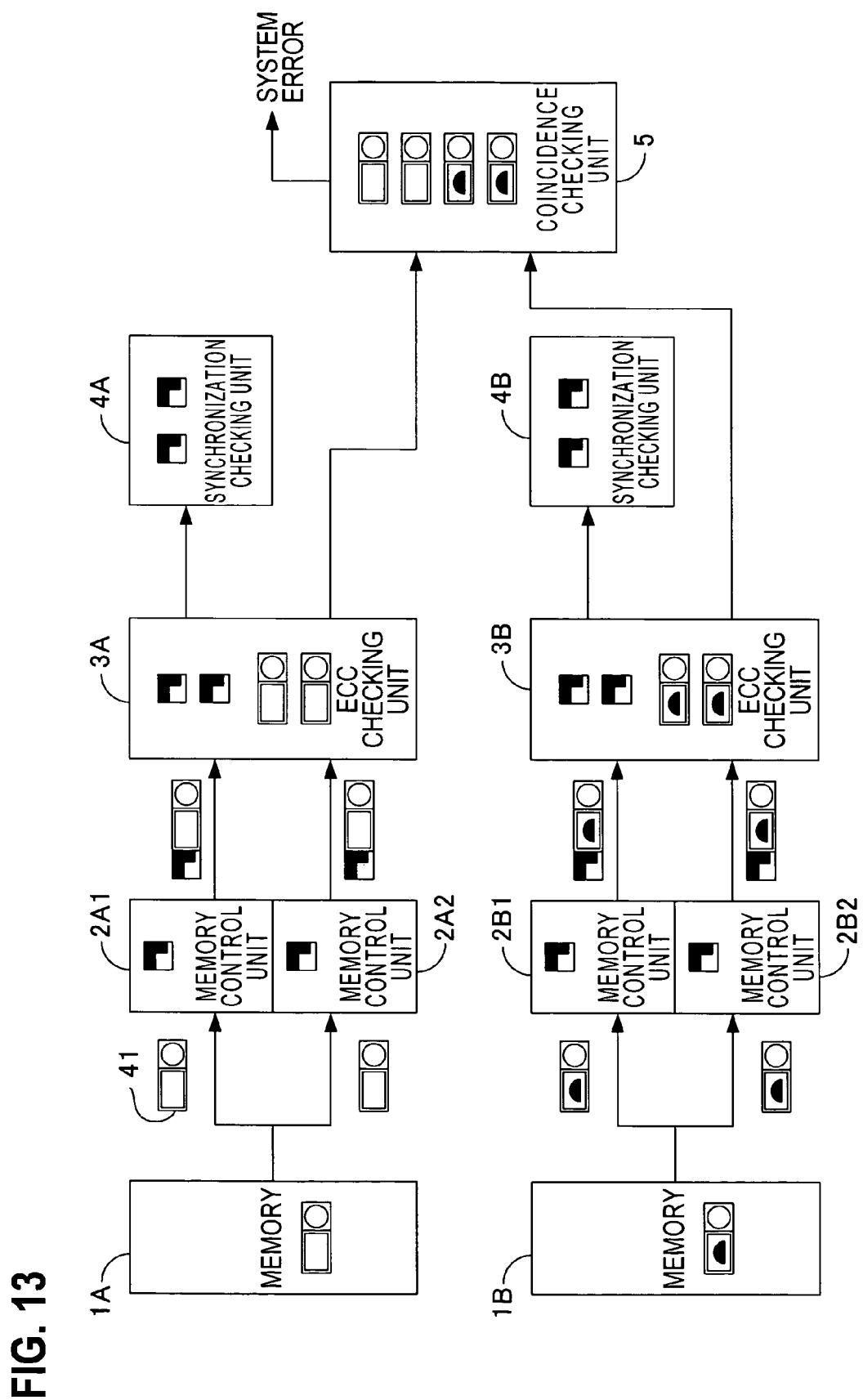
FIG. 13 is an explanatory view of an example of the case where the dual storage apparatus detects an error in a coincidence check on the data.

FIG. 13 is an explanatory view of an example of the case where the dual storage apparatus detects an error in a coincidence check on the data. This shows the case of multiple defects where the set of data read from the memory 1A and the set of data read from the memory 1B are different from each other though no error is detected in a code check and a synchronization check.

First, the set of data 41 read from the memory 1A is inputted into the memory control units 2A1 and 2A2. The memory control units 2Al and 2A2 attach an identical header respectively to the inputted sets of data and input the sets of data with the header 104 into the ECC checking unit 3A.

A code check on the headers and the data is executed in the ECC checking unit 3A. In this check, no error is detected. The ECC checking unit 3A inputs the headers into the synchronization checking unit 4A. In the synchronization checking unit 4A, a synchronization check on the headers is executed. Similarly, in this check, no error is detected.

A same process is also executed for the B system. A code check is executed in the ECC checking unit 3B and a synchronization check is executed in the synchronization checking unit 4B. Similarly, in these checks, no error is detected.

Finally, the set of data read from the memory 1A and the set of data read from the memory 1B are inputted into the coincidence checking unit 5 and a coincidence check is executed on them. Then, discrepancy between the two (2) sets of data can be verified first by the coincidence check. In this case, the selector control unit 6 can not determine which set of data should be used and, therefore, outputs a system error.

In the description of the embodiment, in each of the input/output systems, a copy of the data read from a memory is inputted. However, the dual storage apparatus may be adapted to divide the data read from the memory into two (2) and input the divided data respectively into the memory control unit of each of the input/output systems. For example, the dual storage apparatus may be adapted to divide 72-bit data (64 bits of a data portion plus eight (8) bits of an ECC portion) into two (2) sets of 36-bit data (32 bits of a data portion plus four (4) bits of an ECC portion) and input the former set into the memory control unit 2A1 and the latter set into the memory control unit 2A2.

According to the embodiment described above, the occurrence of malfunction which is conventionally the cause for stopping a computer and degrading the reliability of the computer can be precluded, and continuous operation of the computer is further enabled without degrading the reliability demanded for the computer. For example, the phenomena occurring to computers that use dual storage apparatuses (such as wrong timing of data, loss of data, wrong order of data, etc.) can be precluded. foregoing can be summarized as the following claims.

While the illustrative and presently preferred embodiment of the present invention has been described in detail herein, it is to be understood that the inventive concepts may be otherwise variously embodied and employed and that the appended claims are intended to be construed to include such variations except insofar as limited by the prior art.

What is claimed is:

1. A dual storage apparatus including a first memory and a second memory for respectively retaining identical data, and a selector for selecting either data read from the first memory or from the second memory based on a read control signal inputted into the selector, the dual storage apparatus comprising:

a request management unit, when the read control signal has been inputted, attaching an identifier for identifying the read control signal to the inputted read control signal and outputting the read control signal and the identifier;

a first main memory control unit reading data from the first memory based on the read control signal outputted from the request management unit, and outputting a set of data read from the first memory with the identifier attached to the read control signal outputted from the request management unit;

a first sub memory control unit receiving the read control signal outputted from the request management unit and the data read from the first memory by the first main memory control unit, and outputting the data read from the first memory with the identifier attached to the read control signal outputted from the request management unit;

a second main memory control unit reading the data from the second memory based on the read control signal outputted from the request management unit, and outputting a set of data read from the second memory with the identifier attached to the read control signal outputted from the request management unit;

a second sub memory control unit receiving the read control signal outputted from the request management unit and the data read from the second memory by the second main memory control unit, and outputting the data read from the second memory with the identifier attached to the read control signal outputted from the request management unit;

a synchronization checking unit verifying a coincidence of the identifier outputted from the first memory control unit and the identifier outputted from the first sub memory control unit, and a coincidence of the identifier outputted from the second main memory control unit and the identifier outputted from the second sub memory control unit; and a selector control unit controlling the selector based on a result of the verification performed by the synchronization checking unit.

2. A dual storage apparatus according to claim 1, further comprising:

a coincidence checking unit that further verifies whether or not the set of data read from the first memory and the set of data read from the second memory coincide when the synchronization unit determined that the identifier inputted from the first main memory control unit and the identifier inputted from the first sub memory control unit coincide and the identifier inputted from the second main memory control unit and the identifier inputted from the second sub memory control unit also coincide, wherein the selector control unit outputs a system error when the coincidence checking unit determines that the set of data read from the first memory and the set of data read from the second memory do not coincide.

3. A dual storage apparatus according to claim 1, wherein, when the identifier inputted from the first main memory control unit and the identifier inputted from the first sub memory control unit coincide, the selector control unit controls the selector such that the set of data read from the first memory is selected, and, when the identifier inputted from the first main memory control unit and the identifier inputted from the first sub memory control unit has do not coincide and the identifier inputted from the second main memory control unit and the identifier inputted from the second sub memory control unit coincide, the selector control unit controls the selector such that the set of data read from the second memory is selected.

4. A dual storage apparatus according to claim 1, wherein the selector control unit outputs a system error when the synchronization checking unit determines that the identifier inputted from the first main memory control unit and the identifier inputted from the first sub memory control unit do not coincide, and the identifier inputted from the second main memory control unit and the identifier inputted from the second sub memory control unit do not coincide.

5. A dual storage apparatus according to claim 1, further comprising a code checking unit for checking an error detection/correction code attached to each set of the data, wherein when no uncorrectable error has been detected in the data or the set of data read from the first memory by the code checking unit, the selector control unit controls the selector such that the set of data read from the first memory is selected, and, when an uncorrectable error has been detected in the data or the set of data read from the first memory and no uncorrectable error has been detected in the data or the set of data read from the second memory, controls the selector such that the set of data read from the second memory are selected.

6. A dual storage apparatus according to claim 5, wherein the selector control unit outputs a system error when the code checking unit detects an uncorrectable error in the data or the set of data read from the first memory, and an uncorrectable error in the data or the set of data read from the second memory.

7. A dual storage apparatus according to claim 2, wherein, when the identifier inputted from the first main memory control unit and the identifier inputted from the first sub memory control unit coincide, the selector control unit controls the selector such that the set of data read from the first memory is selected, and, when the identifier inputted from the first main memory control unit and the identifier inputted from the first sub memory control unit do not coincide, and the identifier inputted from the second main memory control unit and the identifier inputted from the second sub memory control unit coincide, controls the selector such that the set of data read from the second memory is selected.

8. A dual storage apparatus according to claim 2, wherein the selector control unit outputs a system error when the synchronization unit determines that the identifier inputted from the first main memory control unit and the identifier inputted from the first sub memory control unit do not coincide, and the identifier inputted from the second main memory control unit and the identifier inputted from the second sub memory control unit do not coincide.

9. A controlling method for a dual storage apparatus including a first memory and a second memory for respectively retaining identical data, and a selector for selecting data read from the first memory or data read from the second memory based on a read control signal inputted into the selector, the controlling method comprising:

producing an identifier for identifying the read control signal when the read control signal has been inputted;

outputting the read control signal and the identifier;

producing first main data containing data read from the first memory and the identifier, by reading the data from the first memory based on the read control signal, and adding the identifier attached to the read control signal to the data read from the first memory;

producing first sub data containing the data read from the first memory and the identifier, by adding the identifier attached to the read control signal to the data read from the first memory;

producing second main data containing data read from the second memory and the identifier, by reading the data from the second memory based on the read control signal, and adding the identifier attached to the read control signal to the data read from the second memory;

producing second sub data containing the data read from the second memory and the identifier, by adding the identifier attached to the read control signal to the data read from the second memory;

verifying coincidence of the identifier contained in the first main data and the identifier contained in the first sub data, and coincidence of the identifier contained in the second main data and the identifier contained in the second sub data; and controlling the selector based on the result of the verifying.

10. A controlling method according to claim 9, further comprising:

verifying whether or not the data read from the first memory and the data read from the second memory coincide when a coincidence of identifiers respectively contained in the first main data and the first sub data and a coincidence of identifiers respectively contained in the second main data and the second sub data have been both confirmed; and outputting a system error when the data read from the first memory and the data read from the second memory do not coincide.

11. A controlling method according to claim 9, further comprising:

controlling the selector such that the data read from the first memory are selected when the coincidence of identifiers respectively contained in the first main data and the first sub data has been verified; and controlling the selector such that the data read from the second memory are selected when the coincidence of identifiers respectively contained in the first main data and the first sub data has not been verified and the coincidence of identifiers respectively contained in the second main data and the second sub data has been verified.

12. A controlling method according to claim 9, further comprising:

outputting a system error when the coincidence of identifiers respectively contained in the first main data and the first sub data and the coincidence of identifiers respectively contained in the second main data and the second sub data have not been both verified.

13. A controlling method according to claim 9, further comprising:

attaching an error detection/correction code to the data;

controlling the selector such that the data read from the first memory are selected when no uncorrectable error has been detected in the first main data and the first sub data; and the dual storage apparatus controls the selector such that the data read from the second memory are selected when an uncorrectable error has been detected in the first main data or the first sub data, and no uncorrectable error has been detected in either the second main data and the second sub data.

14. A controlling method according to claim 13, further comprising:

outputting a system error when an uncorrectable error has been detected in the first main data or the first sub data, and an uncorrectable error has been detected in either the second main data and the second sub data.

15. A controlling method according to claim 10, further comprising:

controlling the selector such that the data read from the first memory are selected when the coincidence of identifiers respectively contained in the first main data and the first sub data has been verified; and controlling the selector such that the data read from the second memory are selected when the coincidence of identifiers respectively contained in the first main data and the first sub data has not been verified and the coincidence of identifiers respectively contained in the second main data and the second sub data has been verified.

16. A controlling method according to claim 10, further comprising:

outputting a system error when the coincidence of identifiers respectively contained in the first main data and the first sub data and the coincidence of identifiers respectively contained in the second main data and the second sub data have not been both verified.

17. A controller comprising:

a first memory control unit reading data stored in a memory based on a received read control signal, the received read control signal including a read request and an identifier identifying the read request, and outputting the data read from the memory and the identifier attached to the received read control signal;

a second memory control unit reading data stored in the memory based on a received read control signal, and outputting the data read from the memory and the identifier attached to the received read control signal; and a synchronization checking unit verifying coincidence of the identifier outputted from the first memory control unit and the identifier outputted from the second memory control unit, and outputting a signal indicating a result of the verifying.

18. A method of selecting data to be output in response to a data request, when the data to which the data request refers to is stored in at least two memories, comprising:

attaching an identifier identifying a read request to the data request and submitting the data request and the identifier to controllers to read the data from the respective at least two memories where the data is stored;

extracting the data from each of the at least two memories, and outputting the data with the identifier by each controller at least twice;

comparing identifiers received with the data output from each of the controllers and outputting data received from one of the controllers, if the identifiers received with the data output from the one controller of the controllers are identical.

* * * * *

UNITED STATES PATENT AND TRADEMARK OFFICE
CERTIFICATE OF CORRECTION

| | | |
|---|---|---|
| PATENT NO. | : 7,467,261 B2 | Page 1 of 1 |
| APPLICATION NO. | : 11/237934 | |
| DATED | : December 16, 2008 | |
| INVENTOR(S) | : Toshikazu Ueki et al. | |

It is certified that error appears in the above-identified patent and that said Letters Patent is hereby corrected as shown below:

Column 13, Line 50 Claim 3, change "control unit has do not" to --control unit do not--.

Signed and Sealed this

Seventeenth Day of March, 2009

JOHN DOLL
*Acting Director of the United States Patent and Trademark Office*